(12) United States Patent
Noritake et al.

(10) Patent No.: US 7,944,045 B2
(45) Date of Patent: May 17, 2011

(54) SEMICONDUCTOR MODULE MOLDED BY RESIN WITH HEAT RADIATION PLATE OPENED OUTSIDE FROM MOLD

(75) Inventors: Chikage Noritake, Aichi-ken (JP);
Takanori Teshima, Okazaki (JP);
Kuniaki Mamitsu, Okazaki (JP)

(73) Assignee: Denso Corporation, Kairya (JP)

( * ) Notice: Subject to any disclaimer, the term of this patent is extended or adjusted under 35 U.S.C. 154(b) by 201 days.

(21) Appl. No.: 12/397,640

(22) Filed: Mar. 4, 2009

(65) Prior Publication Data

US 2009/0224398 A1 Sep. 10, 2009

(30) Foreign Application Priority Data

Mar. 4, 2008 (JP) ................................. 2008-053848

(51) Int. Cl.
*H01L 23/34* (2006.01)
*H01L 23/495* (2006.01)
*H01L 23/10* (2006.01)
*H01L 23/28* (2006.01)

(52) U.S. Cl. ........ 257/712; 257/675; 257/706; 257/707; 257/717; 257/796; 257/E23.087; 257/E23.101

(58) Field of Classification Search .................. 257/675, 257/706, 707, 712, 717, 796, E23.087, E23.101
See application file for complete search history.

(56) References Cited

U.S. PATENT DOCUMENTS

| 5,422,788 A * | 6/1995 | Heinen et al. ................ 361/705 |
| 5,521,437 A * | 5/1996 | Oshima et al. ................ 257/701 |
| 5,539,253 A * | 7/1996 | Nagaune ....................... 257/687 |
| 5,608,267 A * | 3/1997 | Mahulikar et al. ............ 257/796 |
| 6,630,734 B2 * | 10/2003 | Okamoto et al. ............. 257/707 |
| 6,700,194 B2 * | 3/2004 | Nakajima et al. ............. 257/707 |
| 6,787,893 B2 * | 9/2004 | Nakajima et al. ............. 257/687 |
| 6,844,621 B2 * | 1/2005 | Morozumi et al. ........... 257/700 |
| 7,365,422 B2 * | 4/2008 | Liu et al. ...................... 257/706 |
| 7,598,603 B2 * | 10/2009 | Otremba ....................... 257/675 |
| 7,679,182 B2 * | 3/2010 | Yoshinari et al. ............. 257/706 |

(Continued)

FOREIGN PATENT DOCUMENTS

JP 2001-308237 11/2001

(Continued)

OTHER PUBLICATIONS

Japanese Office Action dated Feb. 23, 2010, issued in corresponding Japanese Application No. 2008-053848, with English translation.

*Primary Examiner* — Ida M Soward
(74) *Attorney, Agent, or Firm* — Nixon & Vanderhye PC

(57) ABSTRACT

A semiconductor module and a method of manufacturing the same are disclosed including a semiconductor element having an electrode, a heat radiation plate placed in thermal contact with a main surface of the semiconductor element and electrically connected to the electrode thereof, an insulation body directly formed on an outside surface of the heat radiation plate, a metallic body directly formed on an outside surface of the insulation body and having a thickness lower than that of the insulation body, and a mold resin unitarily molding the heat radiation plate, the semiconductor element and the insulation body. The insulation body is covered with the metallic body and the mold resin and the metallic body has an outside surface exposed to an outside of the mold resin.

9 Claims, 12 Drawing Sheets

U.S. PATENT DOCUMENTS

| | | | |
|---|---|---|---|
| 2003/0022464 A1 | 1/2003 | Hirano et al. | 438/460 |
| 2004/0089928 A1 | 5/2004 | Nakajima et al. | 257/678 |
| 2006/0108700 A1 | 5/2006 | Nakazawa et al. | 257/787 |
| 2007/0145540 A1 | 6/2007 | Mochida | 257/659 |
| 2008/0224285 A1* | 9/2008 | Lim et al. | 257/675 |
| 2009/0194862 A1* | 8/2009 | Kitami | 257/690 |

FOREIGN PATENT DOCUMENTS

| | | |
|---|---|---|
| JP | 2003-110064 | 4/2003 |
| JP | 2004-165281 | 6/2004 |
| JP | 2005-175130 | 6/2005 |
| JP | 2006-147852 | 6/2006 |
| JP | 2007-173680 | 7/2007 |

* cited by examiner

SEMICONDUCTOR MODULE MOLDED BY RESIN WITH HEAT RADIATION PLATE OPENED OUTSIDE FROM MOLD

CROSS REFERENCE TO RELATED APPLICATIONS

This application is based on Japanese Patent Application No. 2008-53848, filed on Mar. 4, 2008, the content of which is hereby incorporated by reference.

BACKGROUND OF THE INVENTION

1. Technical Field of the Invention

The present invention relates to semiconductor module and methods of manufacturing the same and, more particularly, to a semiconductor module, having a semiconductor element and a heat radiation plate, placed in contact with the semiconductor element, which are molded with a mold resin in a unitary structure and a method of manufacturing such a semiconductor module.

2. Description of the Related Art

Attempts have heretofore been made to provide a semiconductor module incorporating a semiconductor element. The semiconductor module includes the semiconductor element and, in addition, a heat radiation plate, placed in thermal contact with the semiconductor element, which are unitarily molded with a mold resin. With such a semiconductor module, the heat radiation plate, placed in thermal contact with the semiconductor element, are exposed in placement to a surface of the semiconductor module for radiating heat generated from the semiconductor element (see Japanese Patent Application Publication Nos. 2003-110064 and 2006-147852: Patent Publications Nos. 1 and 2).

However, since the heat radiation plate is electrically connected to an electrode of the semiconductor element, no cooling unit can be placed in direct contact with the heat radiation plate. Thus, a need arises to provide an insulation member between the heat radiation plate and the cooling unit. Therefore, when assembling the semiconductor module to the heating unit, the separate insulation member is required, resulting in an issue of causing an increase in the number of component parts with a drop in assembling workability.

To address such an issue, an attempt has been made to provide a semiconductor module with a ceramic thin film formed on an outside surface of a heat radiation plate to provide electrical insulation between the heat radiation plate and a cooling unit with no intervening of a separate insulation member (see Japanese Patent Application Publication No. 2001-308237; Patent Publication No. 3).

Further, Japanese Patent Application Publication No. 2005-175130 (Patent Publication No. 4) discloses a semiconductor module with a heat radiation plate placed on an outside surface of an electrode plate. The electrode plate is electrically connected to an electrode of a semiconductor element with an insulation sheet intervening between the electrode plate and the heat radiation plate.

Furthermore, Japanese Patent Application Publication No. 2004-165281 (Patent Publication No. 5) discloses a semiconductor module in which a metallic plate is placed on an outside surface of a heat radiation plate held in thermal contact with a semiconductor element with an insulation resin layer intervening between the heat radiation plate and the metallic plate.

However, with the semiconductor module disclosed in Patent Publication No. 3, the ceramic thin film is exposed to the outside surface. Thus, there is a risk of crack occurring on the ceramic thin film due to an external force applied to the heat radiation plate when assembling the semiconductor module to the cooling unit, causing likelihood of a drop in an insulating function.

With the semiconductor module disclosed in Patent Publication No. 4, the insulation sheet is not bonded to the electrode plate with a resultant issue of causing the insulation sheet to be displaced from the electrode plate. Thus, there is a risk of a difficulty occurring in manufacturing the semiconductor module so as to cause the insulation sheet to reliably exhibit the insulating function. In addition, it is conceivable to bond the insulation sheet onto the electrode plate by adhesive. In this case, there is an increase in heat resistance between the electrode plate and the insulation sheet, causing a risk of a drop in heat radiating property.

With the semiconductor module disclosed in Patent Publication No. 5, further, the metallic plate is disposed on the outside surface of the heat radiation plate via the insulation sheet larger in size than the heat radiation plate. This causes a need to arise to mold the insulation resin layer and the metallic plate with mold resin. This results in the occurrence of the semiconductor module becoming greater in physical size than the heat radiation plate. Thus, it becomes difficult to miniaturize the semiconductor module with a resultant difficulty caused in improving heat radiating property.

With the semiconductor module disclosed in Patent Publication No. 5, furthermore, the heat radiation plate is placed on only one side of the semiconductor module and, hence, there is a limit in increasing heat radiating property.

SUMMARY OF THE INVENTION

The present invention has been completed with a view to addressing the above issues and has an object to provide a semiconductor module, available to be easily manufactured and easily assembled to a cooling unit while having excellent heat radiating capability, and a method of manufacturing the same.

To achieve the above object, a first aspect of the present invention provides a semiconductor module comprising: a semiconductor element having an electrode; a heat radiation plate placed in thermal contact with a main surface of the semiconductor element and electrically connected to the electrode of the semiconductor element; an insulation body directly formed on an outside surface of the heat radiation plate, the heat radiation plate, the semiconductor element and the insulation body being stacked on each other to form a stack body; a mold resin unitarily molding the stack body; and a metallic body directly formed on an outside surface of the insulation body. The insulation body is covered with the metallic body and the mold resin. The metallic body has an outside surface exposed to an outside of the mold resin.

The semiconductor module of such a structure has advantageous effects as listed below.

The heat radiation plate has the outside surface on which the insulation body is directly formed and the metallic body is directly formed on the outside surface of the insulation body. In addition, the metallic body is exposed to the outside of the mold resin. This allows a cooling unit to be placed on the metallic body in contact therewith to enable the semiconductor element to radiate heat at increased efficiency while enabling to ensure insulating property between the semiconductor element and the cooling unit.

As set forth above, further, the semiconductor module unitarily incorporates the metallic body that is electrically insulated from the heat radiation plate with the insulation body.

This results in no need to cause a separate member to intervene between the semiconductor module and the cooling unit and the semiconductor module can be directly assembled to the cooling unit. This enables the semiconductor module to be easily assembled to the cooling unit at increased assembling capability.

Further, the insulation body is directly formed on the outside surface of the heat radiation plate and the metallic body is directly formed on the insulation body. Thus, no insulation body is displaced from the heat radiation plate and no metallic body is displaced from the insulation body during assembly of the semiconductor module. This allows the semiconductor module to be easily manufactured, while ensuring reliable insulating property between the heat radiation plate and the metallic body.

With the semiconductor module of the present embodiment, the metallic body has the end edges placed inward of the end edges of the insulation body. This enables adequate insulating resistance to be provided between the heat radiation plate and the metallic body.

Further, the insulation body is covered with the metallic body and the mold resin and is not exposed to the outside surface of the semiconductor module. Therefore, the heat radiation plate, placed inward of the insulation body, remains in a state buried in an internal part of the mold resin by a value equivalent to a total thickness of the insulation body and the metallic body. This enables increased electrical insulation resistance to be provided between the heat radiation plate and the metallic body and between the heat radiation plate and the outside surface of the semiconductor module in a manner as will be discussed later.

Furthermore, the insulation body is not exposed to the outside surface of the semiconductor module. Thus, there is no risk of damage occurring to the insulation body while enabling the prevention of a drop in insulating property during a process of assembling the semiconductor module onto the cooling unit.

Further, since the metallic body is directly formed on the outside surface of the insulation body, insulating property of the insulation body can be easily checked. That is, if the metallic body is not bonded to the outside surface of the insulation body, a need arises to measure a withstand voltage upon using electrode pads that are pressed against the insulation body so as to cover an entire surface thereof. However, there is likelihood that it is difficult to cause the electrode pads to be reliably pressed against the entire surface of the insulation body. Therefore, there is a risk of a difficulty occurring in achieving accurate measurement.

With the structure of the semiconductor module of the present embodiment, in contrast, the metallic body is directly formed on the outside surface of the insulating body and, hence, no need arises for the electrode pads of such large sizes to be pressed against the insulation body. In this case, placing the electrode on the metallic body in contact therewith allows the withstand voltage to be measured, enabling insulating property of the insulation body to be adequately checked.

As set forth above, the present invention enables the provision of a semiconductor module that can be easily manufactured and can be easily assembled onto a cooling device while having increased heat radiating property.

The semiconductor module of the present embodiment may preferably comprise the metallic body having end edges placed at positions displaced inward from end edges of the insulation body; the insulation body including a main surface portion, covering the outside surface of the heat radiation plate, and sidewall portions directly formed on at least parts of end edges of the heat radiation plate; and the metallic body having end edges placed at positions displaced inward from end edges of the insulation body.

The semiconductor module of such a structure has advantageous effects as listed below.

With the semiconductor module, the insulation body is directly formed on the outside surface of the heat radiation plate and the metallic body is directly formed on the outside surface of the insulation body. In addition, the metallic body is exposed to the outside of the mold resin. This enables the semiconductor element to radiate heat at increased efficiency, while ensuring insulating property between the semiconductor element and the cooling unit.

Further, the semiconductor module unitarily incorporates the metallic body electrically insulated from the heat radiation plate with the insulation body. Thus, the semiconductor module can be assembled to the cooling unit with no need for preparing a separate insulation member intervening between the semiconductor module and the cooling unit.

Furthermore, the insulation body is directly formed on the outside surface of the heat radiation plate and the metallic body is directly formed on the outside surface of the insulation body. This results in an ease of manufacturing the semiconductor module while reliably obtaining insulating property between the heat radiation plate and the metallic body without causing any risk of displacement of the insulation body with respect to the heat radiation plate and displacement of the metallic body with respect to the insulation body.

Further, insulation body includes the main surface portion, directly formed on the outside surface of the heat radiation plate, and the sidewall portions directly formed on at least the parts of the end edges of the heat radiation plate. The metallic body is directly formed on the outside surface of the insulation body with the end edges placed at the inward positions backed off from the end edges of the insulation body. This enables insulating property to be adequately obtained between the heat radiation plate and the metallic body.

Furthermore, the insulation body is covered with the metallic body and the mold resin and none of parts of the insulation body is exposed to an outside surface of the semiconductor module. This allows the heat radiation plate, placed inward of the insulation body, to remain in a state buried in an internal part of the resin mold body by a depth equivalent to a total thickness of the insulation body and the metallic body. This results in an increase in electrical insulating property between the heat radiation plate and the metallic body and between the heat radiation plate and the outside surface of the semiconductor module.

Moreover, the insulation body is not exposed to the outside surface of the semiconductor module. Thus, when assembling the semiconductor module onto the cooling unit, there is no risk of damage occurring to the insulation body with the prevention of a drop in insulating function.

Further, since the metallic body is directly formed on the outside surface of the insulation body, insulating property of the insulation body can be easily checked.

In addition, the insulation body is directly formed on the outside surface of the heat radiation plate and at least the parts of the end edges of the heat radiation plate. Thus, even if an attempt is made to increase a size of the metallic body formed on the outside surface of the insulation body, it becomes possible to ensure an adequate insulating effect between the heat radiation plate and the metallic body. As a result, the semiconductor module can have increased heat radiating property.

As set forth above, the present invention can provide a semiconductor module that can be easily manufactured and easily assembled to a cooling unit while having excellent heat radiating capability.

A second aspect of the present invention provides a method of manufacturing a semiconductor module, the method comprising the steps off: preparing a semiconductor element having an electrode; locating a heat radiation plate on a main surface of the semiconductor element placed in thermal contact therewith and electrically connecting the heat radiation plate to the electrode of the semiconductor element; bonding the semiconductor element and the heat radiation plate to each other for providing a stack body; forming an insulation body directly on an outside surface of the heat radiation plate; forming a metallic body directly on an outside surface of the insulation body; molding the stack body, the insulation body and the metallic body with a mold resin; and machining a surface of the metallic body and the mold resin to cause the metallic body to have an outside surface exposed to an outside of the mold resin.

The method of manufacturing the semiconductor module has various advantageous effects as listed below.

With the manufacturing method of the present invention, it becomes possible to easily manufacture the semiconductor module of the first aspect of the present invention. That is, the semiconductor module can be easily manufactured with an ease to be assembled to a cooling unit while having excellent heat radiating capability.

With the manufacturing method of the present invention, further, the mold resin is formed on the stack body the insulation body and the metallic body so as to cover these component parts, after which the surface of the metallic body and the mold resin are subjected to machining such as cutting or grinding to cause the metallic body to be exposed to the outside of the mold resin. This enables the metallic body to be easily exposed to the outside surface of the semiconductor module without causing the insulation body to be exposed to the outside surface of the semiconductor module. In addition, the metallic body can be smoothed in surface, enabling an increase in a contact surface area between the metallic body and the cooling unit to be placed in contact therewith. This enables the semiconductor module to have increased heat radiating property.

As set forth above, the present invention can provide a method of manufacturing a semiconductor module that can be easily manufactured and easily assembled to a cooling unit while having excellent heat radiating capability.

With the method of manufacturing the semiconductor module, the step of forming the metallic body comprises forming the metallic body directly on the outside surface of the insulation body such that end edges of the metallic body are placed at positions displaced inward from end edges of the insulation body; the step of forming the insulation body comprises forming a main surface portion directly on the outside surface of the heat radiation plate and sidewall portions directly on at least parts of end edges of the heat radiation plate; and the step of forming the metallic body comprises forming the metallic body such that the metallic body has end edges placed at positions displaced inward from end edges of the insulation body.

The method of manufacturing the semiconductor module of the present embodiment has various advantageous effects as listed below.

With the manufacturing method of the present invention, it becomes possible to easily manufacture the semiconductor module of the second aspect of the present invention. That is, the semiconductor module can be easily manufactured with an case to be assembled to a cooling unit while having excellent heat radiating capability.

Further, like the semiconductor module of the first aspect of the present invention, the metallic body can be easily exposed to the outside surface of the semiconductor module without causing the outside surface of the insulation body to be exposed to the outside surface of the semiconductor module. In addition, the surface of the metallic body is smoothed, enabling an increase in surface contact area between the metallic body and the cooling unit placed in contact therewith. This results in capability of increasing head radiating property of the semiconductor module.

Further, the insulation body is directly formed on not only the outside surface of the heat radiation plate but also the parts of the end faces of the heat radiation plate. Thus, even if the insulation body is formed with the metallic body having a large size, adequate insulation can be ensured between the heat radiation plate and the metallic plate. As a result, it becomes possible to obtain increased heat radiating property.

According to the present invention, as set forth above, it becomes possible to provide a semiconductor element that can be easily manufactured with an ease to be assembled to a cooling unit and having excellent heat radiating capability.

The semiconductor module, implementing the present invention, car be applied to electric power converters such as, for instance, an inverter and a converter, etc.

Further, the semiconductor module may include a single semiconductor element or a plurality of semiconductor elements. Furthermore, the semiconductor module may take the form of, for instance, an IGBT (Insulated Gate Bipolar Transistor), a MOSFET (Metal-Oxide Semiconductor Field-Effect Transistor) or a diode, etc.

With the semiconductor module implementing the present invention, the insulation body may be formed on the parts of the end edges of the heat radiation plate or on a whole surface thereof.

Further, the insulation body may preferably include the main surface portion, directly formed on the outside surface of the heat radiation plate, and the sidewall portions directly formed on at least parts of the end edges of the heat radiation plate.

With such a structure, further increased insulating property can be obtained between the heat radiation plate and the metallic body. This results in a capability of obtaining a semiconductor module having further increased insulating property.

With the semiconductor module of such a structure, the insulation body may be formed on the parts of the end edges of the heat radiation plate or on a whole surface thereof.

With the semiconductor module of the present embodiment, the metallic body may be preferably formed on a whole area of the outside surface of the insulation body.

With such a structure, the metallic body can have an increased surface area as large as possible, thereby enabling an outside surface, serving as a heat radiating surface, of the metallic body to be exposed to the outside of the semiconductor module in an increased surface area. This results in a capability of obtaining a semiconductor module having further increased heat radiating property.

With the semiconductor module of the present embodiment, the insulation body may preferably include an insulation film formed on the heat radiation plate in a film by at least one of CVD, PVD and thermal spraying.

With such a structure, the insulation body can be formed in a thin and dense film without causing any inclusion such as adhesive to intervene. This results in a reduction in thermal resistance, while adequately ensuring electrically insulating property. Thus, a semiconductor can be easily obtained with a structure having excellent heat radiating capability and insulating property.

With the semiconductor module of the present embodiment, the metallic body may preferably include a metallic film formed on the insulation body in a film by at least one of PVD (Physical Vapor Deposition) and CVD (Chemical Vapor Deposition).

In this case, the metallic body can be easily and directly formed on the outside surface of the insulation body in an easy and reliable fashion.

In addition, the metallic body may be, preferably formed by other step such as, for instance, metallizing plating.

With the semiconductor module of the present embodiment, further, the insulation body may be preferably made of inorganic material.

With such a structure, the insulation body can be reduced in thickness, enabling the provision of a semiconductor module having excellent heat radiating capability.

Examples of inorganic material may include, for instance, alumina, silicon oxide, silicon nitride, yttrium oxide, zirconium oxide, AlN, SiON, SiCN, SiC and SiOC, etc.

With the semiconductor module of the present embodiment, furthermore, the metallic body may be preferably made of metal selected from a group consisting of aluminum, nickel, copper, silver, gold or an alloy of these components.

With such a structure, the metallic body can have increased thermal conductivity, thereby enabling the provision of a semiconductor module having excellent heat radiating capability. In addition, this allows the metallic body to be easily machined by cutting or grinding.

With the semiconductor module of the present embodiment, moreover, the heat radiation plate may be preferably made of metal selected from a group consisting of aluminum, copper or an alloy of these components.

With such a structure, the metallic body can have increased thermal conductivity, thereby enabling the provision of a semiconductor module having excellent heat radiating capability.

With the semiconductor module of the present embodiment, besides, the heat radiation plate may preferably include a pair of heat radiation plates placed on both main surfaces of the semiconductor element.

With such a structure, the semiconductor element can be cooled at both main surfaces, enabling the semiconductor module to have further increased heat radiating property.

BRIEF DESCRIPTION OF THE DRAWINGS

These and other features and advantages of the present invention will become more apparent in light of the following description, as illustrated in the accompanying drawings, in which.

DETAILED DESCRIPTION OF PREFERRED EMBODIMENTS

Now, semiconductor modules of various embodiments according to the present invention and methods of manufacturing the semiconductor modules of the various embodiments will be described below in detail with reference to the accompanying drawings. However, the present invention is construed not to be limited to such embodiments described below and technical concepts of the present invention may be implemented in combination with other known technologies or the other technology having functions equivalent to such known technologies.

In the following description, it is to be understood that such terms as "inward", "outside", "end", "edge", "terminal" and the like are words of convenience and are not to be construed as limiting terms.

Embodiments

First Embodiment

A semiconductor module of one embodiment according to the present invention and a method of manufacturing the same will be described below in detail with reference to FIGS. 1 to 13 of the accompanying drawings.

Figure 1:
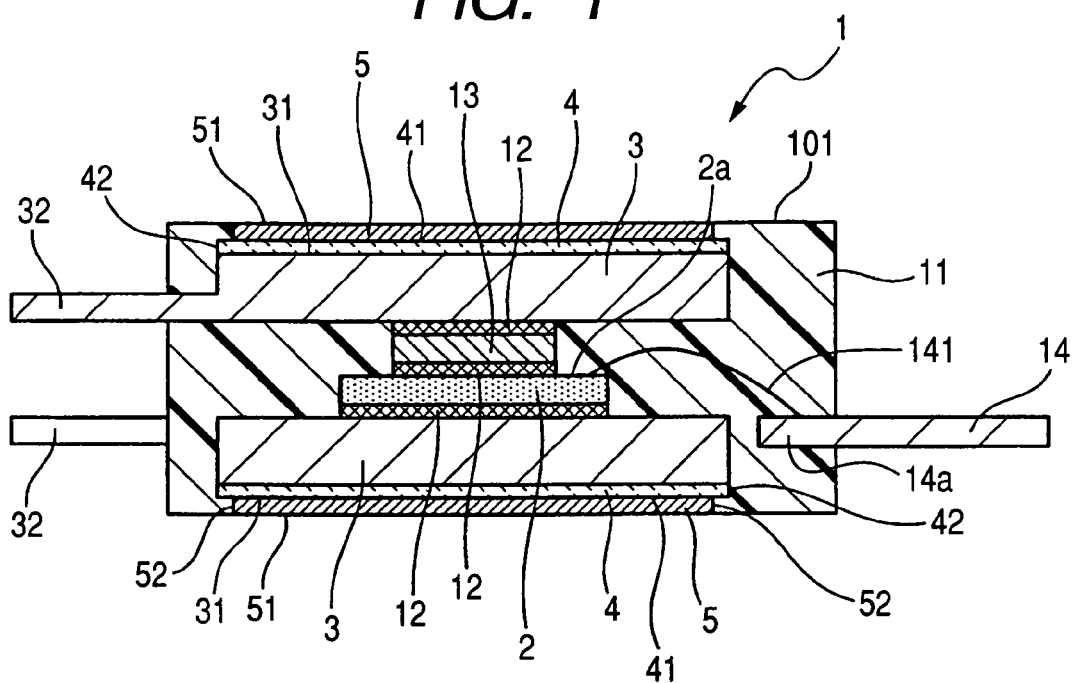
FIG. 1 is a cross-sectional view showing a semiconductor module of a first embodiment according to the present invention.

As shown in FIG. 1, the semiconductor module 1 of the present embodiment includes a semiconductor element 2, and a pair of heat radiation plates 3, placed in thermal contact with the semiconductor element 2 on both main surfaces thereof and electrically connected to electrodes of the semiconductor element 2, both of which are molded with a mold resin 11 in a unitary structure.

The pair of heat radiation plates 3 has outside surfaces 31 on which insulation bodies 4 are directly formed, respectively. The insulation bodies 4 have outside surfaces 41 on which metallic bodies 5 are directly formed with end edges 52 placed at positions displaced inward from end edges 42 of the insulation bodies 4, respectively.

Figure 3:
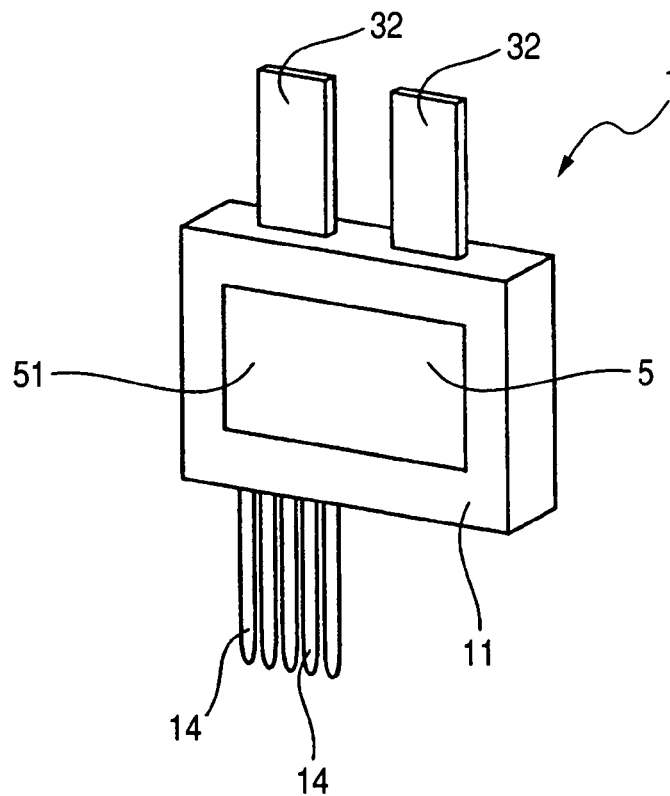
FIG. 3 is a perspective view of the semiconductor module of the first embodiment shown in FIG. 1.

Thus, each of the insulation bodies 4 is covered with each of the metallic bodies 5 and the mold resin 11 and the metallic bodies 5 have outside surfaces 51 exposed to the outside of the mold resin 11 (see FIGS. 1 and 3).

The insulation bodies 4 include insulation films formed on the outside walls 31 of the heat radiation plates 3 by chemical vapor deposition (CVD), respectively. In particular, each of the insulation films is composed of an alumina film made of inorganic material. In addition, the metallic bodies 5 include metallic films formed on the outside walls 41 of the insulation bodies 4 by a physical vapor deposition (PVD), respectively. In particular, each of the metallic films is composed of an aluminum film formed by sputtering.

Further, each insulation body 4 has a thickness, increasing or decreasing depending a desired dielectric strength voltage, which lies in a value ranging from, for instance, 10 to 30 μm. Each of the metallic bodies 5 has a thickness of a value ranging from 10 to 200 μm.

The semiconductor module 1 is used in electrical power converter devices such as an inverter and a converter, etc.

As shown in FIG. 1, with the semiconductor module 1, the semiconductor element 2 has one surface to which one heat radiation plate 3, made of copper, is bonded via a soldering layer 12 and the other surface to which a spacer 13, made of copper, is bonded via another soldering layer 12. The spacer 13 has one surface facing the semiconductor element 2 and the other surface to which the heat radiation plate 3 is bonded via the other soldering layer 12. This allows the semiconductor element 2 to be thermally bonded to the pair of heat radiation plates 3.

Though not shown in the drawing figures, the semiconductor module 1 incorporates therein two pieces of semiconductor elements 2 one of which is an IGBT (Insulated Gate Bipolar Transistor) and the other of which is a diode.

The spacer 13 is formed in size smaller than the semiconductor element (IGBT) 2. The semiconductor element 2 has the surface, facing the spacer 13, which is formed with base terminals 2a that are electrically connected to one end portions 14a of signal terminals 14 via bonding wires 141, The signal terminals 14) supported with the molded resin 11, have the other end portions extending laterally outward from the molded resin 11. In addition, the semiconductor element (IGBT) 2 has the other surface, facing the spacer 13 and formed with an emitter terminal, and the one surface formed with a collector terminal. The emitter and collector terminals are electrically connected to the pair of heat radiation plates 3, respectively.

The heat radiation plates 3 have protruding ends formed with electrode terminals 32, respectively, which protrude laterally outward from the mold resin 11, respectively, as shown in FIGS. 1 and 3. In additions the signal terminals 14 protrude laterally outward of the mold resin 11 in a direction opposite to the electrode terminals 32.

The insulation bodies 4 are deposited on whole surfaces of the heat radiation plates 3 on the outside surfaces 31, respectively. Here, it is assumed that the outside surfaces 31 of the heat radiation plates 3 do not involve surfaces of the electrode terminals 31. Moreover, the outside surfaces 41 of the insulation bodies 4 carry thereon the metallic bodies 5, respectively, which are formed in the respective films each smaller in size than each of the insulation bodies 4.

Figure 4:
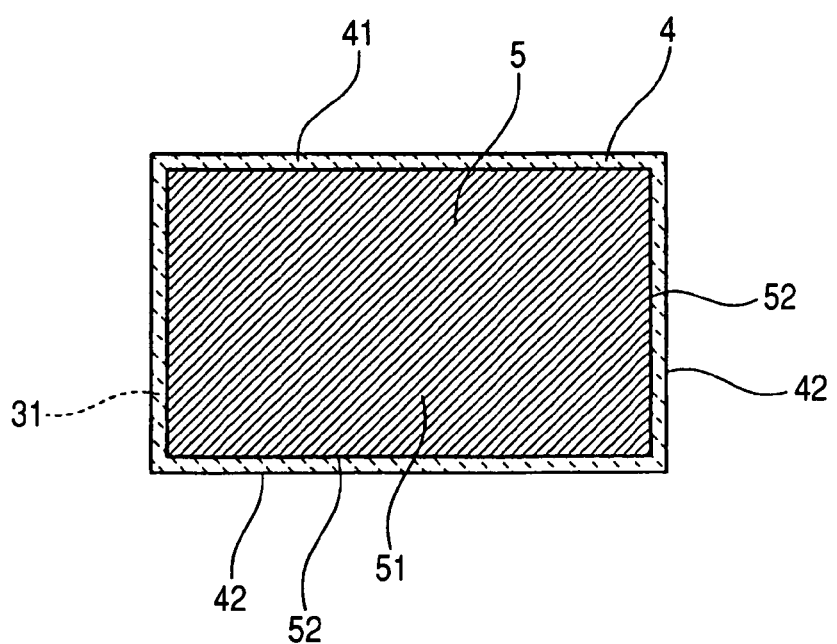
FIG. 4 is a plan view of the semiconductor module of the first embodiment as is viewed in a direction perpendicular to outside surfaces of an insulation body and a metallic body.

As shown in FIG. 4, the outside wall 31 of the heat radiation plate 3, formed in a rectangle shape, has a whole area on which the insulation body 4 is formed in a film. The metallic body 5 is formed on the insulation body 4 in a film in rectangle shape such that al end edge of the metallic body 5 is placed inward of the end edge 42 of the insulation body 4. That is, the rectangle shape of the metallic body 5 has a contour placed inward of a contour of the rectangle shape of the insulation body 4.

Figure 2:
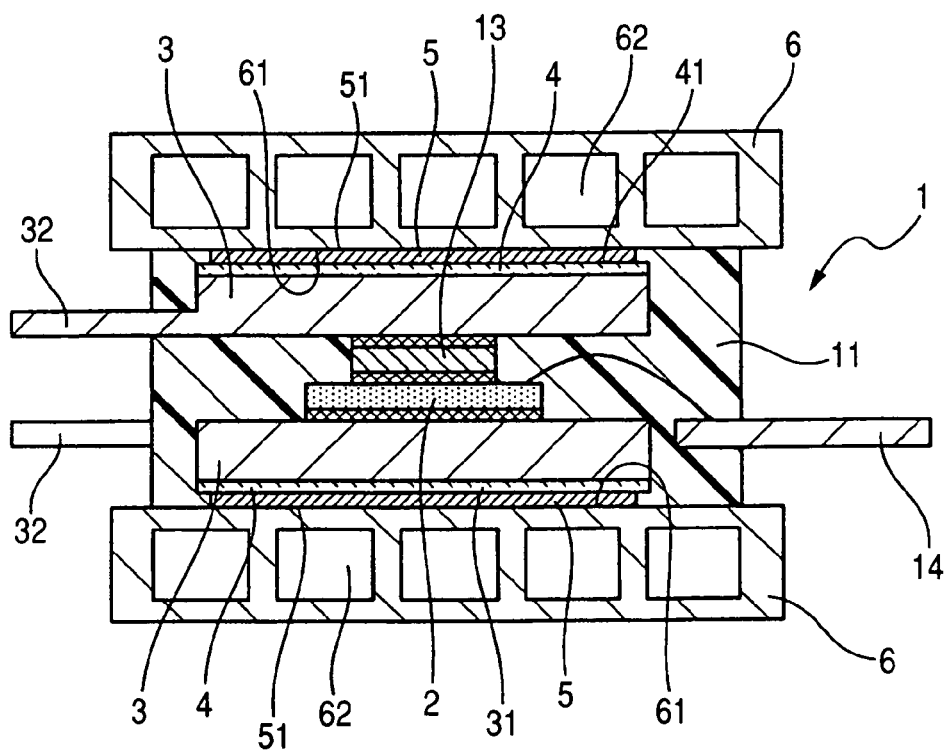
FIG. 2 is a cross-sectional view of the semiconductor module of the first embodiment having both sides held in close contact with cooling units.

As shown in FIG. 2, the semiconductor module 1 is used with both of main surfaces held in tight contact with cooling units 6, respectively. In particular, the cooling units 6 have cooling surfaces 61 held in contact with the outside surfaces 51 of the metallic bodies 5 at positions exposed to the both of the main surfaces, respectively.

Each of the cooling units 6, made of metallic material such as aluminum having excellent heat conductivity, includes cooling medium flow passages 62 laterally juxtaposed to each other to admit the flow of cooling medium. Moreover, the present invention is not limited to the cooling units 6 of the type using such cooling medium but may employ cooling units each formed with, for instance, cooling fins for cooling purposes.

Now, a method of manufacturing the semiconductor module 1 of the present embodiment will be described below in detail.

Figure 5:
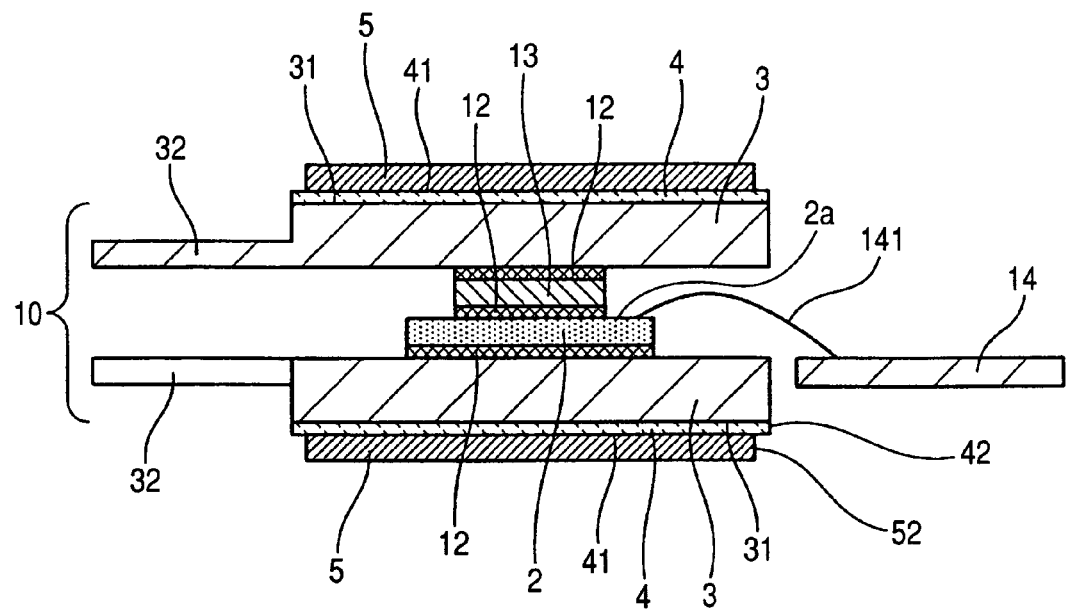
FIG. 5 is a cross-sectional view illustrating a method of manufacturing the semiconductor module of the first embodiment before a stack body and relevant component parts are molded with a mold resin.

As shown in FIG. 5, first, the spacer 13 is stacked on the semiconductor element 2 via the soldering layer 12 and the pair of heat radiation plates 3 are stacked on the spacer 13 and the semiconductor element 2 which are consequently sandwiched with the pair of heat radiation plates 3, thereby preparing a stack body 10. Then, the insulation bodies 4 are directly formed on the outside surfaces 31 of the heat radiation plates 3, respectively, after which the metallic bodies 5 are directly formed on the outside surfaces 41 of the insulation bodies 4, respectively. In this case, the end edges 52 are placed inward of the end edges 42 of the insulation bodies 4, respectively. During forming step, the insulation bodies 4 and the metallic bodies 5 may be preferably formed in respective films before the stack body 10 is formed.

Further, the signal terminals 14 are electrically connected to the base terminals 2a of the semiconductor element 2 via the bonding wires 141.

Furthermore, the films of the insulation bodies 4 are formed by CVD (Chemical Vapor Deposition), and the films of the metallic bodies 5 are formed by sputtering, etc.

Figure 6:
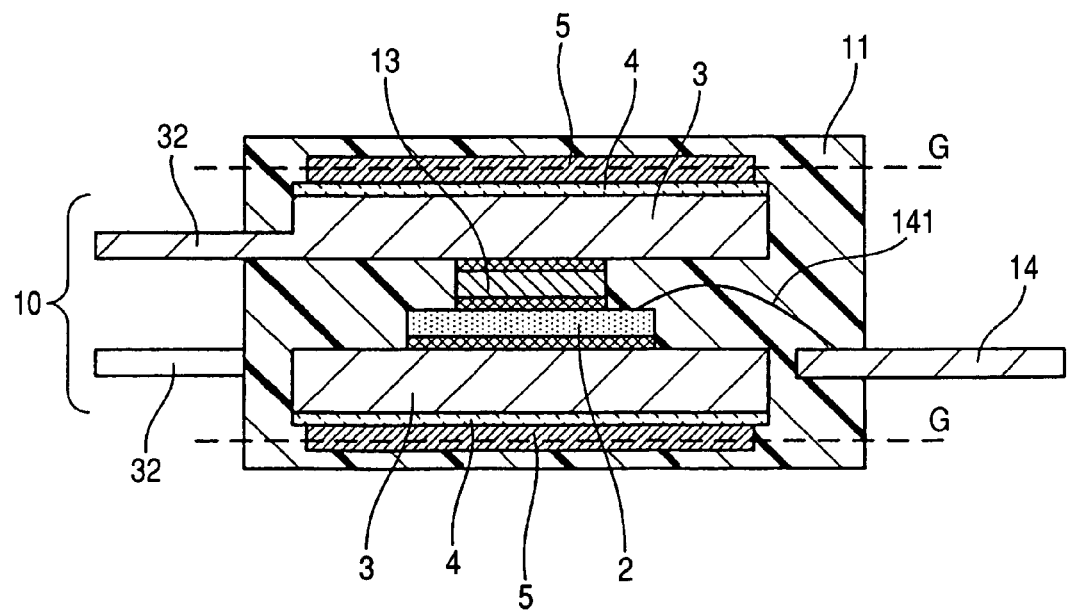
FIG. 6 is a cross-sectional view illustrating the method of manufacturing the semiconductor module of the first embodiment after the stack body and the relevant component parts are molded with the mold resin.

Subsequently, the stack body 10, the insulation bodies 4 and the metallic bodies 5 are covered with the mold resin 11 to embed the stack body 10, the insulation bodies 4 and the metallic bodies 5 in a structure as shown in FIG. 6. Examples of the mold resin 11 may preferably include, for instance, epoxy mold resin. During molding step, the mold resin 11 is applied to all the constructional elements of the semiconductor module 1 except for parts of the pair of electrode terminals 32 and the signal terminals 14.

Next, machining the surfaces of the pair of metallic bodies 5 and the mold resin 11 by cutting or grounding causes the metallic bodies 5 to be exposed to the outside of the mold resin 11. That is, the machining is conducted on the mold resin 11 and the metallic bodies 5 up to shaping positions indicated by broken lines G in FIG. 6.

With the foregoing steps conducted in the manner set forth above, the semiconductor module 1 is obtained with the both surfaces to which the outside surfaces 51 of the metallic bodies 5 are exposed.

The semiconductor module 1 of the present embodiment has various advantageous effects as will be described below.

The insulation bodies 4 are directly formed on the outside surfaces 31 of the pair of heat radiation plates 3. The metallic bodies 5 are directly formed on the outside surfaces 41 of the insulation bodies 4 with the end edges 52 of the metallic bodies 5 being placed inward of the end edges 42 of the insulation bodies 4, respectively. In addition, the metallic bodies 5 are exposed to the outside of the mold resin 11. Thus, placing the cooling units 6 on the pair of metallic bodies 5 in direct contact therewith as shown in FIG. 2, respectively, enables the semiconductor element 2 to efficiently perform heat radiation, with insulating property being ensured between the semiconductor element 2 and the cooling units 6.

As sot forth above, further, the semiconductor module 1 takes the form of a unitary structure incorporating the metallic bodies 5 insulated from the heat radiation plates 3 via the insulation bodies 4, respectively. Thus, no need arises for insulation members to be provided as separate component parts between the semiconductor module 1 and the cooling units 6, respectively, and the semiconductor module 1 can be directly assembled to the cooling units 6. This results in improved assembling workability of the semiconductor module 1 with respect to the cooling units 6.

Further, the insulation bodies 4 are directly formed on the outside surfaces 31 of the heat radiation plates 3, respectively, and the metallic bodies 5 are directly formed on the outside surfaces 31 of the insulation bodies 3, respectively. Therefore, when manufacturing the semiconductor module 1, no risk occurs for the insulation bodies 4 to be displaced from the heat radiation plates 3, respectively and the metallic bodies 3 to be displaced from the insulation bodies 4, respectively.

This provides an ease of manufacturing the semiconductor module 1, while reliably obtaining insulating property between the heat radiation plates 3 and the metallic bodies 5.

Furthermore, the metallic bodies 5 are formed on the insulation bodies 4 with the end edges 52 being placed inward of the end edges 42 of the insulation bodies 4, respectively. This adequately ensures insulating property between the heat radiation plates 3 and the metallic bodies 5.

Figure 9:
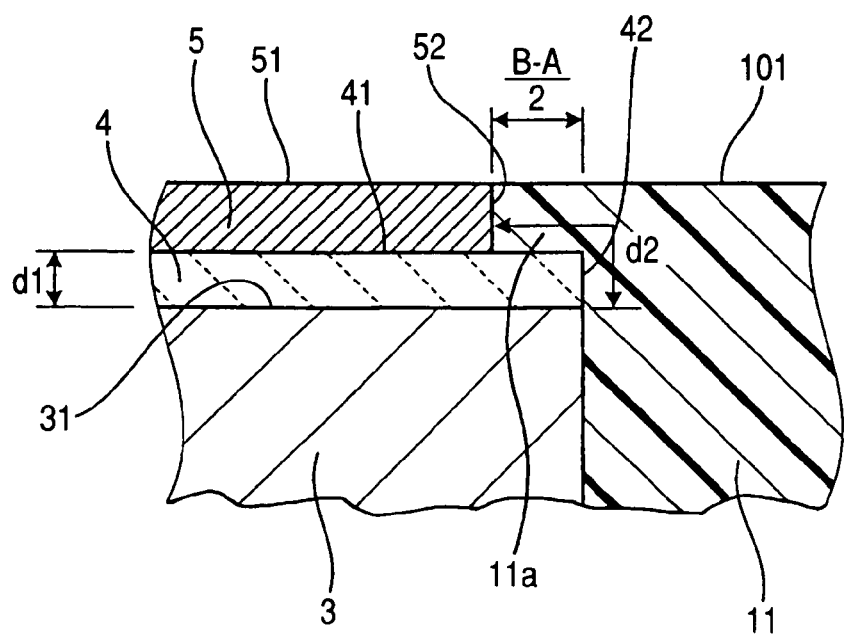
FIG. 9 is a fragmentary enlarged cross-sectional view of the semiconductor module of the first embodiment represented in the vicinity of an end portion of the insulation body.
Figure 10:
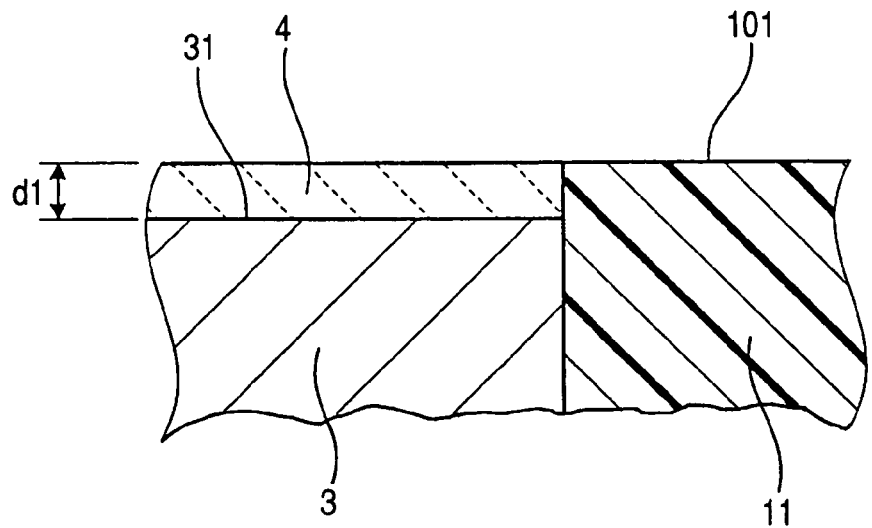
FIG. 10 is a fragmentary enlarged cross-sectional view of a semiconductor module represented in the vicinity of an end portion of the insulation body in the absence of a metallic body.

Moreover, the insulation bodies 4 are covered with the metallic bodies 5 and the mold resin 11 such that the insulation bodies 4 are not exposed to an external surface of the semiconductor module 1. As shown in FIG. 9, therefore, the heat radiation plate 5, directly formed on the insulation body 5 in the area inward of the end edge 42, remains in a state under which the heat radiation plate 3 is buried inside of the mold resin 11 by a distance equivalent to a total thickness of the insulation body 4 and the metallic body 5. As described below, therefore, electrically insulating properties increase between the heat radiation plate 5 and the metallic body 5 and between the heat radiation plate 3 and the external surface of the semiconductor module 1.

That is, if no metallic body 5 is placed on the outside wail 41 of the insulation body 4, then the heat radiation plate 3 remains in a state buried in the mold resin 11 by a depth equivalent to a thickness d1 of the insulation body 4. However, this results in an effect of having an in-solid-body insulating distance between the heat radiation plate 3 and the external surface 101 of the semiconductor module 1 failing in a value equal to only the thickness d1 of the insulation body 4. As used herein, the term "in-solid-body insulating distance" refers to a distance between a boundary surface between the insulation body 4 and the mold resin 11 and the external surface 101 of the semiconductor module 1.

That is, the in-solid-body insulating distance represents a distance in which an internal part of a solid body has a path lying in a minimal resistance value. On the contrary, an insulation space distance, representing a distance of a path in which the solid body has a surface having a minimal resistance value, needs to be adequately longer than the in-solid-body insulating distance. Otherwise no equivalent insulation resistance can be obtained.

Figure 11:
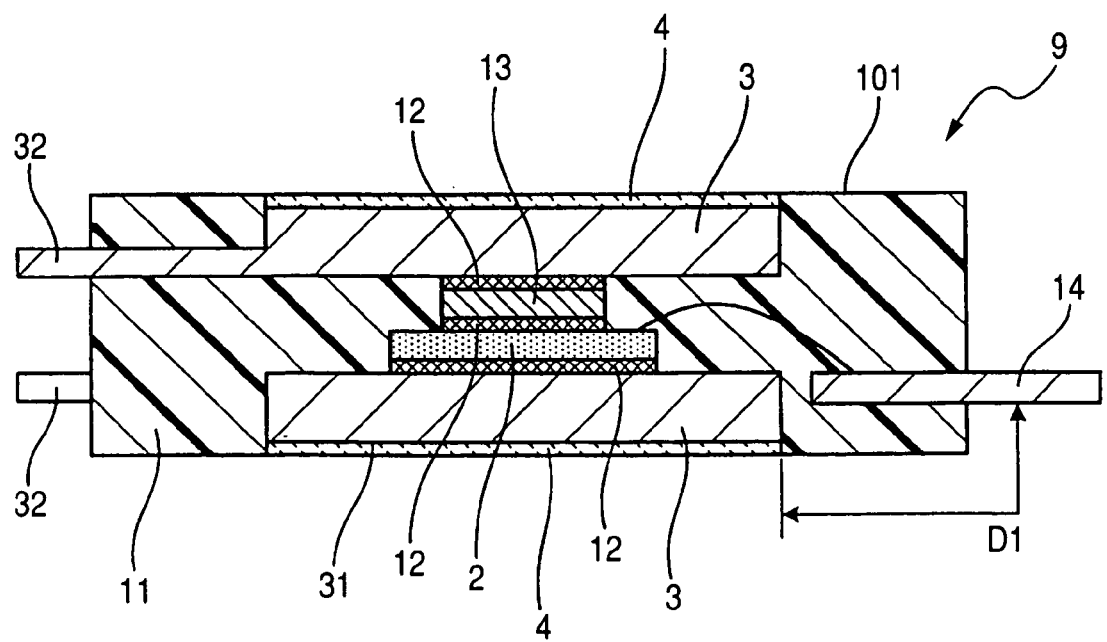
FIG. 11 is a cross-sectional view of the semiconductor module in the absence of the metallic body.

Therefore, if the semiconductor module 9 cannot ensure the in-solid-body insulating distance only by a value equivalent to the thickness of the insulation body 4, the semiconductor module 9 needs to have an increased insulation space distance D1 between the edge of the heat radiation plate 3 and the signal terminal 14 as shown in FIG. 11. This results in an increase in a physical body of the semiconductor module 9.

Figure 8:
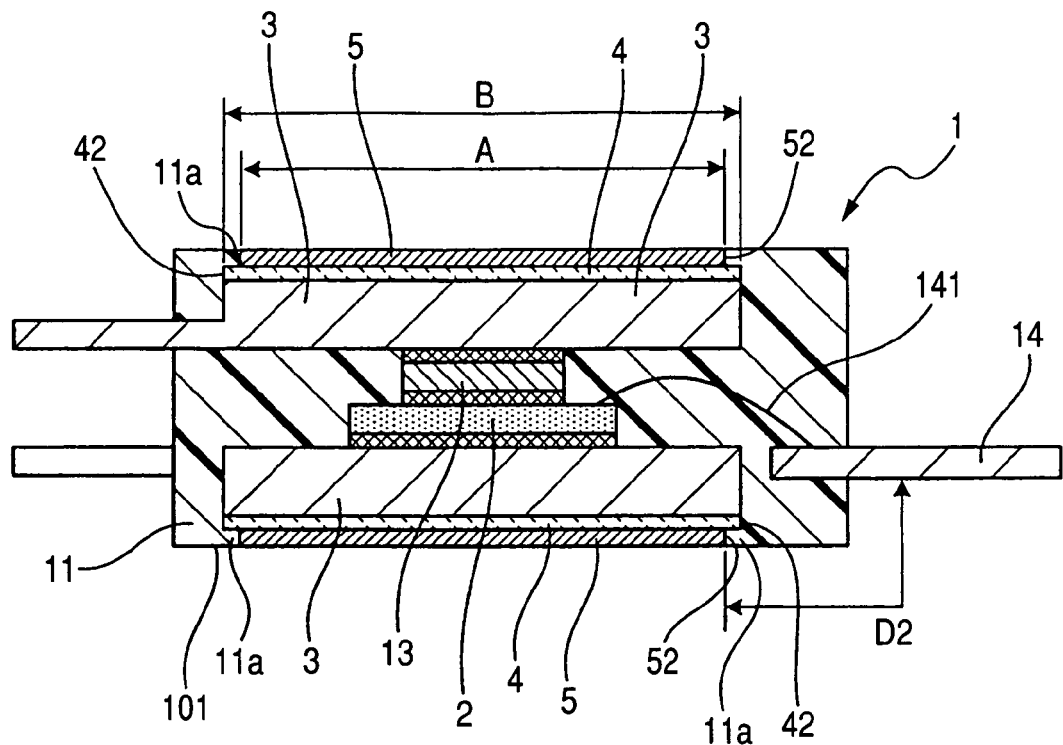
FIG. 8 is a cross-sectional view illustrating the semiconductor module of the first embodiment to represent dimensions on various parts inclusive of an insulation space distance of the semiconductor module of the first embodiment.

In contrast, with the semiconductor module 1 of the present embodiment, the metallic bodies 5 are formed on the outside surfaces 41 of the insulation bodies 4, respectively, with the end edge 52 of each metallic body 5 being placed in the area inward of the edge 42 of each insulation body 4. As shown in FIG. 8, that is, for instance, each metallic body 5 has a length A shorter than a length B of each insulation body 4. As shown in FIG. 9, therefore, the in-solid-body insulating distance is equivalent to a distance d2 involving the thickness d1 of the insulation body 4 and a distance of (B−A)/2 between the end edge 42 of the insulation body 4 and the end edge 52 of the metallic body 5. This enables a remarkably increased in-solid-body insulating distance to be obtained. As shown in FIG. 8, therefore, no need arises to increase the insulation space distance D2, enabling a reduction in physical size of the semiconductor module 1.

As set forth above, moreover, the semiconductor module 1, having the structure enabling such an increase in the in-solidbody insulating distance, can have an increased insulating resistance between the heat radiation plate 3 and the metallic body 5, i.e., an increased insulating resistance between the semiconductor module 1 and the cooking unit 6.

In other words, as shown in FIGS. 8 and 9, the mold resin 11 has inward protrusions 11a each having an end face kept in tight contact with the end edge 52 of each metallic body 5. This increases the in-solid-body insulating distance between the end edge 42 of the insulation body 4 and the end edge 52 of the metallic body 5. This allows the semiconductor module 1 to have increased insulation resistance without causing an increase in physical size of the semiconductor module 1.

Further, none of the insulation bodies 4 is exposed to the external surface 101 of the semiconductor module 1. Thus, no risk of damage occurs to the insulation bodies 4 during a process of assembling the semiconductor module 1 to the cooling units 6, while preventing the occurrence of deterioration in an insulating function.

Figure 12:
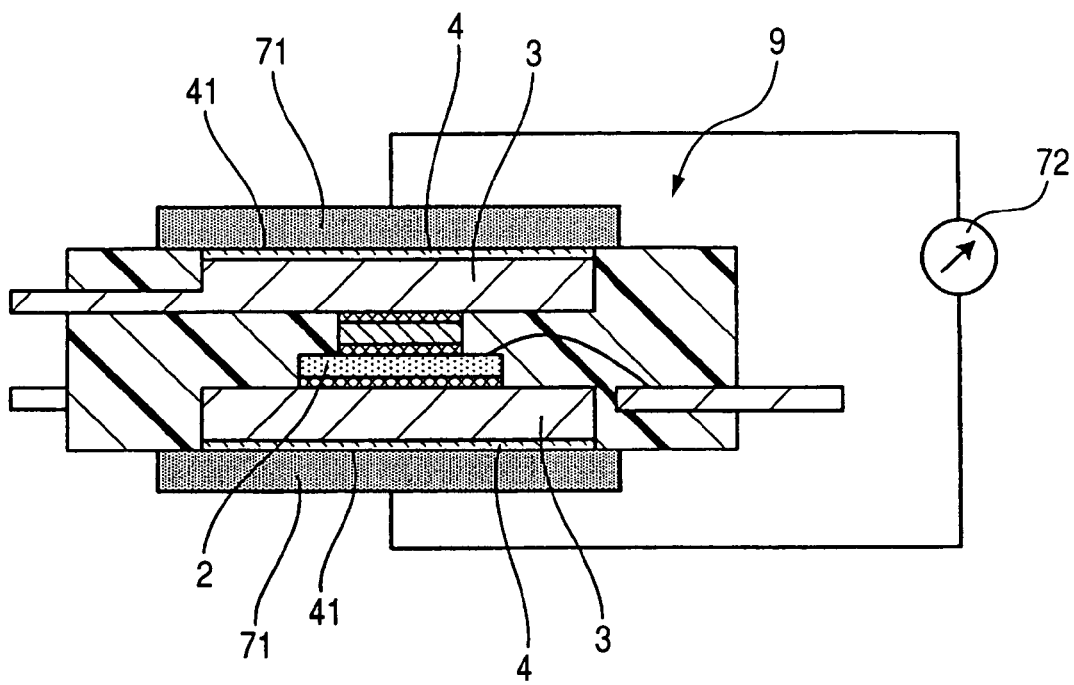
FIG. 12 is a cross-sectional view of the semiconductor module in the absence of the metallic body representing how a withstand voltage measurement method is conducted.

Furthermore, since the metallic bodies 5 are directly formed on the outside surfaces 41 of the insulation bodies 4, respectively, the insulating properties of the insulating bodies 4 can be easily inspected. If the metallic bodies 5 are not bonded to the outside surfaces 41 of the insulation bodies 4, respectively, as shown in FIG. 12, electrode pads 71 need to be pressed against the insulation bodies 4 so as to cover the entire surfaces of the insulation bodies 4 for measuring a withstand voltage. However, there is likelihood of a difficulty caused in reliably pressing the electrode pads 71 against the insulation bodies 4. This results in a risk of a difficulty occurring in performing the measurement of the withstand voltage in a reliable manner.

On the contrary, with the metallic bodies 5 directly formed on the outside surfaces 41 of the insulation bodies 4, respectively, no need arises to press the electrode pads 71 of the large sizes against the insulation bodies 4. That is, measuring electrodes can be directly brought into electrical contact with the metallic bodies 5 for measuring the withstand voltage, thereby adequately enabling insulating properties of the insulation bodies 4 to be ensured as shown in FIG. 13.

Figure 13:
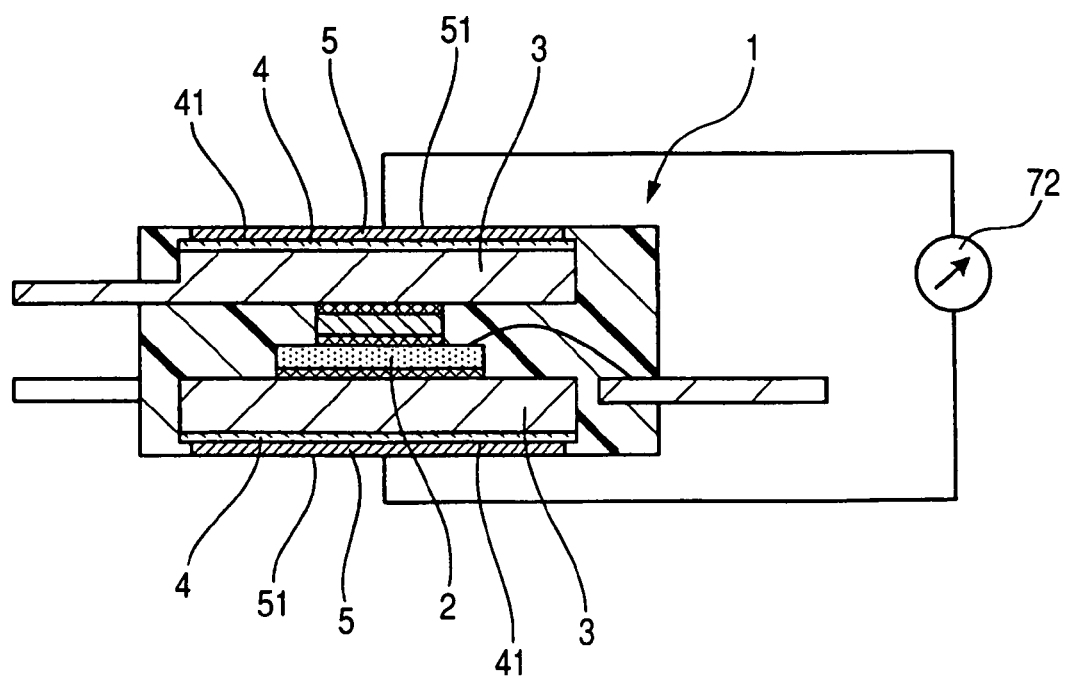
FIG. 13 is a cross-sectional view of the semiconductor module of the first embodiment representing how the withstand voltage measurement method is conducted.

In FIGS. 12 and 13, moreover, reference numeral 72 denotes a withstand voltage testing unit.

Further, the insulation bodies 4 are composed of the insulation films formed on the outside surfaces 31 of the heat radiation plates 3 by chemical vapor deposition (CVD). Therefore, the insulating films can be formed on the heat radiation plates, respectively, with no need for intervening substances such as adhesive to be provided. This enables the insulation bodies 4 to be formed in thin and dense films, respectively, enabling a reduction in thermal resistance while adequately ensuring electrically insulating property. Therefore, it becomes possible to easily obtain the semiconductor module 1 having excellent heat radiating capability and insulating property.

Furthermore, the metallic bodies 5 are formed in films by the sputtering method. This enables the metallic bodies 5 to be directly formed on the outside surfaces 41 of the insulation bodies 4 in an easy and reliable manner.

Moreover, since the insulation bodies 4 are made of alumina, each of the insulation bodies 4 can have a reduced thickness, enabling the provision of the semiconductor module 1 having excellent heat radiating capability.

Further, since the metallic bodies 5 are made of aluminum with increased thermal conductivity. This allows the semiconductor module 1 to have increased heat radiating capability. In addition, the metallic bodies 5 can be easily machined by cutting or grounding.

Furthermore, the heat radiation plates 3 are made of copper, thereby providing increased thermal conductivity. This makes it possible to obtain the semiconductor module 1 having excellent heat radiating capability.

Moreover, with the method of manufacturing the semiconductor module set forth above, the mold resin 11 is formed in a manner to cover the stack body 10, the insulation bodies 4 and the metallic bodies 5. Thereafter, machining the surfaces of the pair of metallic bodies 5 and the mold resin 11 by cutting or grinding allows the metallic bodies 5 to be exposed to the outside. This enables the metallic bodies 5 to be easily exposed to the outside of the mold resin 11. Further, this allows the surfaces (outside surfaces 51) of the metallic bodies 5 to be smoothed, thereby enabling an increase in a contact surface area between the metallic bodies 5 and the cooling units 6 held in contact therewith. This results in a capability of obtaining the semiconductor, module 1 having improved heat radiating capability.

Figure 7A:
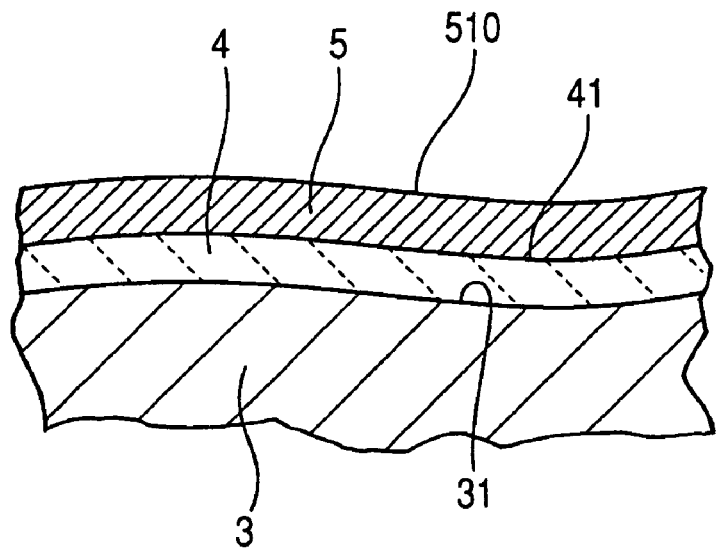
FIG. 7A is a cross-sectional view illustrating the relationship among a heat radiation plate, the insulation body and the metallic body before the semiconductor module of the first embodiment is subjected to the machining by cutting or grinding.

That is, as shown in FIG. 7, there is likelihood of causing the outside surface 31 of the heat radiation plate 3 to be unleveled or waved when subjected to heat during soldering. If the insulation body 4 and the metallic body 5 are formed on the outside surface 31 of the heat radiation plate 3 in thin films under such an unleveled or waved state, the metallic body 5 has a surface (outside surface 510) remained under an unieveled or waved state as shown in FIG. 7A. Then, if the cooling unit 6 is brought into contact with the surface (outside surface 510) of the metallic body 5 for assembly, the surface (outside surface 510) of the metallic body 5 tends to have a decreased contact surface area with a resultant risk of a drop occurring in heat radiating efficiency.

Figure 7B:
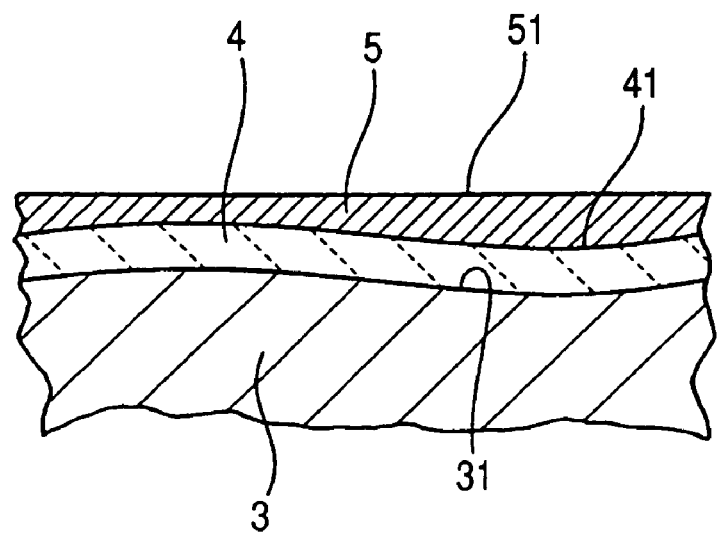
FIG. 7B is a cross-sectional view illustrating the relationship among the heat radiation plate, the insulation body and the metallic body after the semiconductor module of the first embodiment is subjected to the machining by cutting or grinding.

With the use of the manufacturing method set forth above, however, the surface of the metallic body 5 can be machined by cutting or grinding, thereby forming a smooth outside surface 51 as shown in FIG. 7B. This makes it possible to obtain the semiconductor module 1 having excellent heat radiating capability.

With the present embodiment, as set forth above, it becomes possible to provide a semiconductor module, available to be easily manufactured with a capability to be easily assembled to cooling units while having increased heat radiating property, and a method of manufacturing the same.

Second Embodiment

A semiconductor module of a second embodiment according to the present invention and a method of manufacturing the same are described below with reference to FIG. 14.

Figure 14:
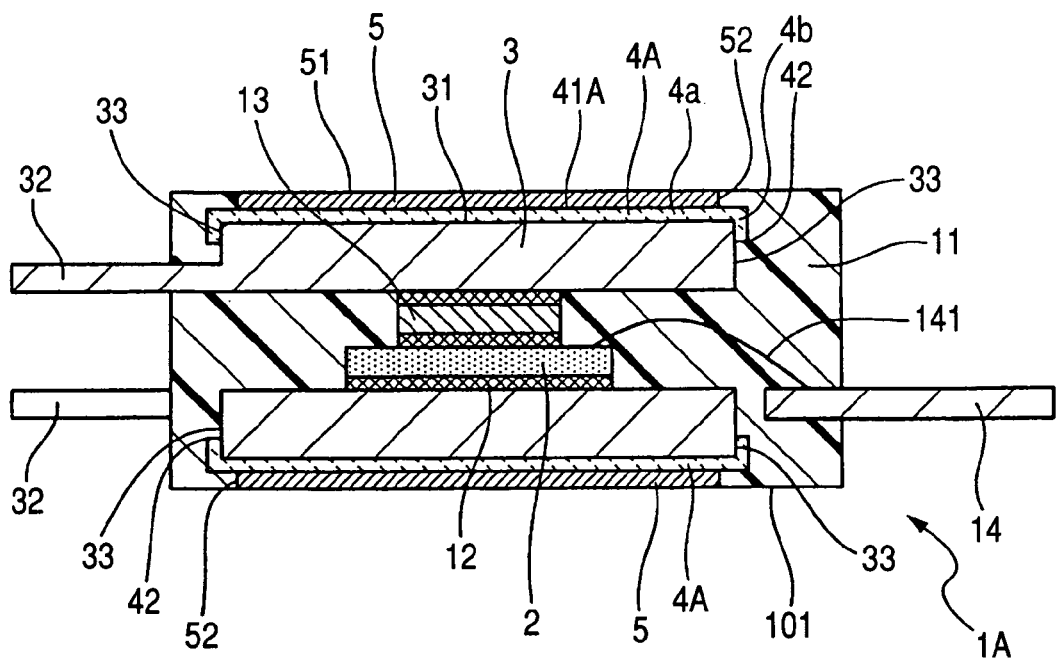
FIG. 14 is a cross-sectional view showing a semiconductor module of a second embodiment according to the present invention.
Figure 15:
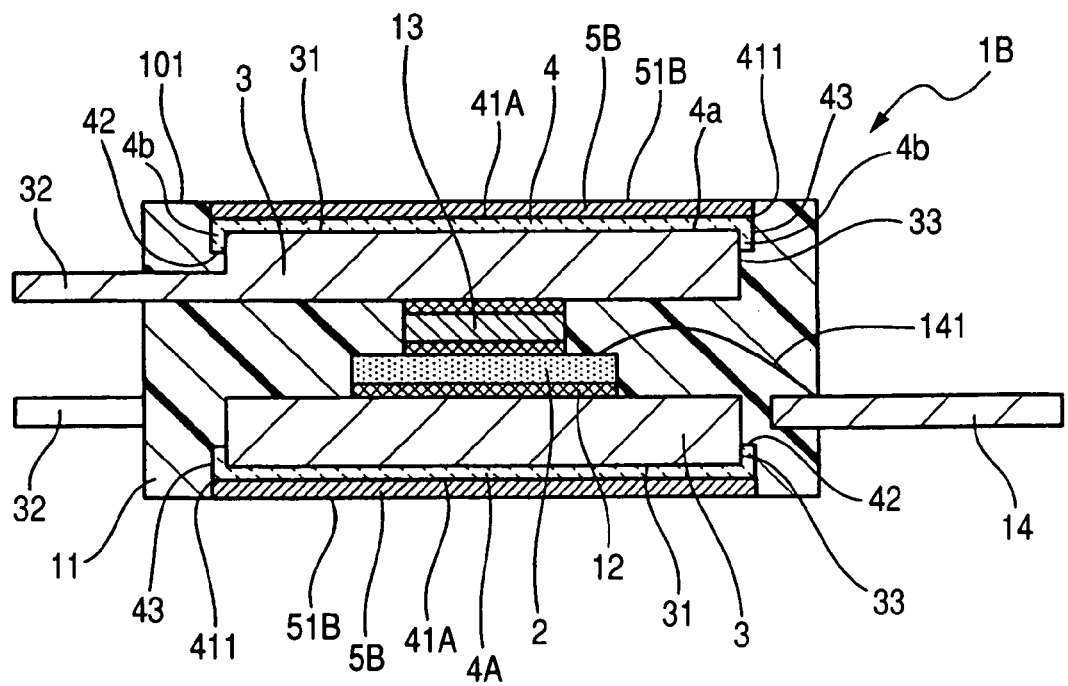
FIG. 15 is a cross-sectional view showing a semiconductor module of a third embodiment according to the present invention.

The semiconductor module 1A of the present embodiment, shown in FIG. 14, differs from the semiconductor module 1 of the first embodiment in respect of insulation bodies 4A that are formed so as to cover parts of end faces 33 of the heat radiation plates 3, respectively.

More particularly, each of the insulation bodies 4A has a main surface portion 4a, covering an entire surface of the outside surface 31 of each heat radiation plate 3, and sidewall portions 4b formed on four sides of the main surface portion 4a to cover parts of four end faces 33 of each heat radiation plate 3 at positions in close proximity to the outside surface 31 of the heat radiation plate 3. With such a structure, the main surface portion 4a, formed over the entire surface of the outside surface 31 of each heat radiation plate 3, and the sidewall portions 4b, placed on the four end faces 33 of each heat radiation plate 3, are continuously formed with each other.

The semiconductor module 1A of the present embodiment has the other same structure as that of the semiconductor module of the first embodiment.

The method of manufacturing the semiconductor module 1A of the present embodiment differs from the method of manufacturing the semiconductor module 1 of the first embodiment in that the insulation bodies 4A are formed in films over expanded areas to cover not only the main surfaces of the outside surfaces 31 of the heat radiation plates 3 and the parts of the end faces 33 of the heat radiation plates 3, respectively. The method of manufacturing the semiconductor module 1A of the present embodiment includes other same steps as those of the method of manufacturing the semiconductor module 1 of the first embodiment.

With such a structure of the present embodiment, the semiconductor module 1A has further increased insulating property between the heat radiation plate 3 and the metallic body 5. That is, the structure of the insulation body 4A can have an increased in-solid-body insulating distance. This results in an increase in insulating property between the heat radiation plate 3 and the metallic body 5, while enabling an increase in insulating property between the heat radiation plate 3 and the signal terminal 14.

As a result, it becomes possible to obtain the semiconductor module 1A having further increased insulating property.

The semiconductor module 1A also has the same other advantages as those of the semiconductor element 1 of the first embodiment.

Third Embodiment

A semiconductor module of a third embodiment according to the present invention and a method of manufacturing the same are described below with reference to FIGS. 15 to 18.

The semiconductor module 1B of the present embodiment differs from the semiconductor module 1 of the first embodiment in that the insulation bodies 4A are directly formed on the heat radiation plates 3 in the expanded areas, respectively, so as to cover the outside surfaces 31 of the pair of heat radiation plates 3 and at least the parts of the end faces 33 of the heat radiation plates 3, respectively, while metallic bodies 5B are directly formed outside surfaces 41A of the insulation bodies 4A in whole surface areas covering edge portions 411.

That is, the semiconductor module 1B of the present embodiment is similar in structure to the semiconductor module 1A of the second embodiment shown in FIG. 14 in that each of the insulation bodies 4A has the main surface portion 4a, covering the entire surface of the outside surface 31 of each heat radiation plate 3, and the sidewall portions 4b formed on the four sides of the main surface portion 4a to cover the parts of the four end faces 33 of each heat radiation plate 3 at the positions in close proximity to the outside surface 31 of the heat radiation plate 3. With the semiconductor module 1B of the present embodiment, however, metallic bodies 5B are formed on whole surfaces areas of the outside surfaces 41A of the insulating bodies 4A, respectively. In addition, none of the metallic bodies 5 are formed on the sidewall portions 4b of each insulation body 4 in areas closer to end edges 42 thereof than edge portions 411. That is, none of the metallic bodies 5 is formed on end surfaces 43 of each insulation body 4 covering end faces 33 of each heat radiation plate 3.

The semiconductor module 1B of the present embodiment has the other same structure as that of the semiconductor module of the first embodiment.

Figure 16:
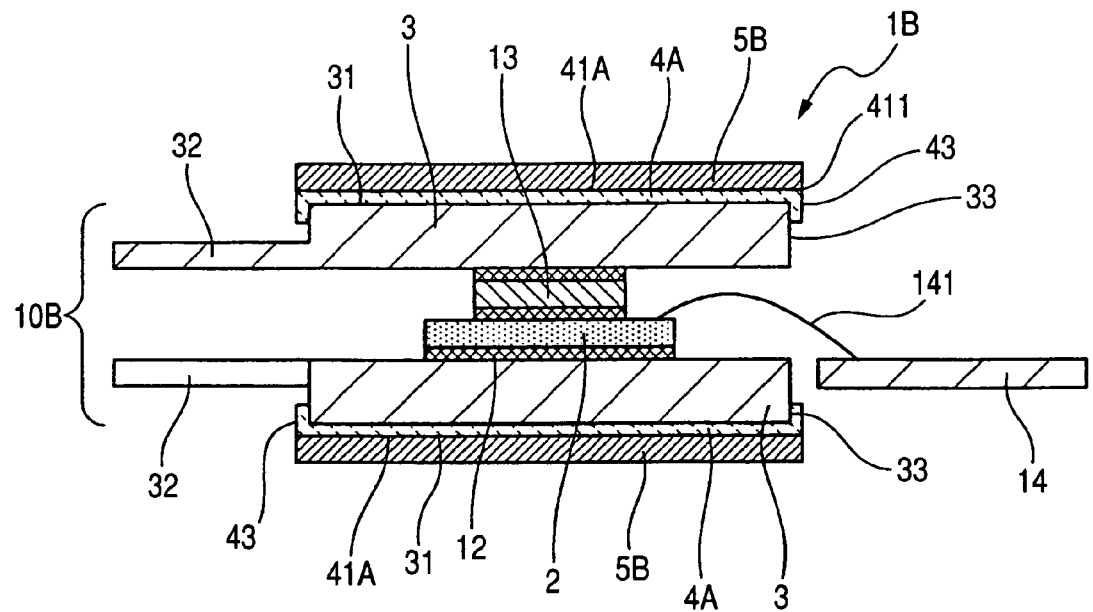
FIG. 16 is a cross-sectional view illustrating a method of manufacturing the semiconductor module of the third embodiment before a stack body and relevant component parts are molded with a mold resin.

With the method of manufacturing the semiconductor module 1B of the present embodiment, the metallic bodies 5B are formed in films in a manner as shown in FIG. 16. That is, the metallic bodies 5B are formed on the whole surfaces areas of the outside surfaces 41A of the insulation bodies 4 in areas covering the edge portions 411. The method of manufacturing the semiconductor module 1B of the present embodiment includes other same steps as those of the method of manufacturing the semiconductor module 1A of the second embodiment.

Figure 17:
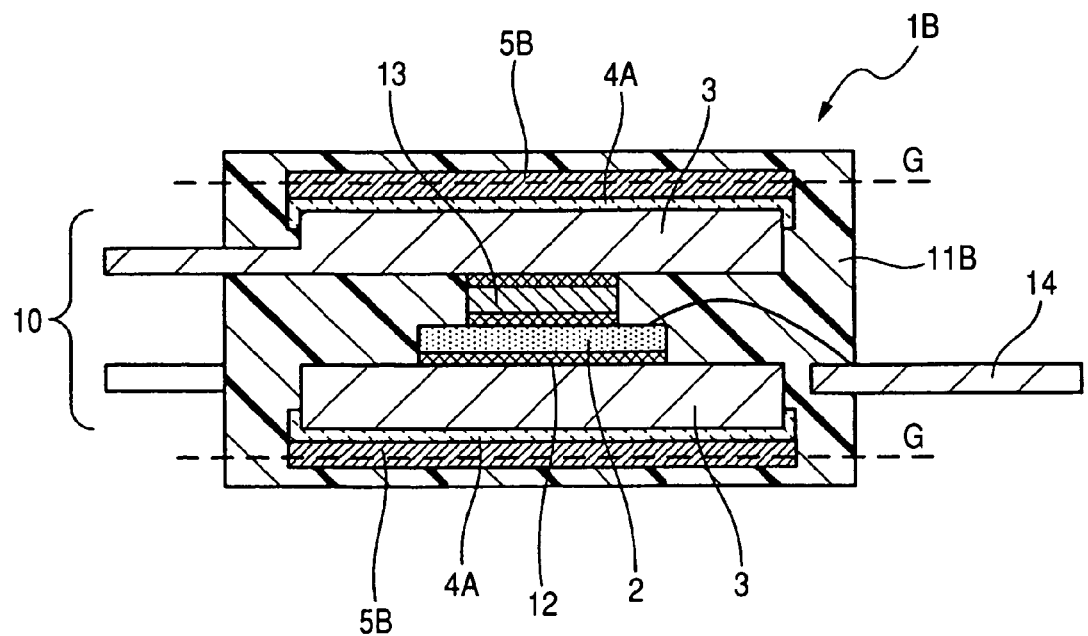
FIG. 17 is a cross-sectional view illustrating the method of manufacturing the semiconductor module of the third embodiment after the stack body and the relevant component parts are molded with the mold resin.

That is, as shown in FIGS. 16 and 17, the semiconductor element 2, the spacer 13 and the pair of heat radiation plates 3 are stacked on one another to form a stack body 10B. Then, the insulation bodies 4 are formed on the stack body 10B at both sides thereof, after which the metallic bodies 5 are formed on the outside surfaces 41A of the insulator bodies 4A, respectively, thereby forming a subassembly. Subsequently, the subassembly is fully covered with a mold resin 11B.

Then, machining surfaces of the pair of metallic bodies 5B and the mold resin 11B to positions indicated by broken lines G by cutting or grinding allows the metallic bodies 5B to be exposed to the outside of the mold resin 11B.

With the semiconductor module 1B of the present embodiment, the insulation bodies 4A are directly formed on the outside surface 31 of the heat radiation plates 3 at the entire surfaces thereof and the parts of the four end faces 33 of the heat radiation plates 3, respectively. Therefore, even if the metallic bodies 5B are formed on the outside surfaces 41 of the insulation bodies 4 in increased sizes, it becomes possible to ensure increased insulating property between each heat radiation plate 3 and each metallic body 5.

Thus, no need arises for the metallic bodies 5B to have end edges placed inward of the end faces 33 of the heat radiation plates 3 as required in the semiconductor module 1 of the first embodiment.

With the semiconductor module 1B of the present embodiment, the metallic bodies 5 are formed on the entire outside surfaces 41A of the insulation bodies 4A in the areas covering the edge portions 411. This results in an increase in each of the surface areas of the metallic bodies 5, causing outside surfaces 51B of the metallic bodies 5B to be exposed to the outside of the semiconductor module 1B in increased surfaces areas as radiating surfaces. As a result, it becomes possible to obtain the semiconductor module 1B having further increased heat radiating efficiency.

Figure 18:
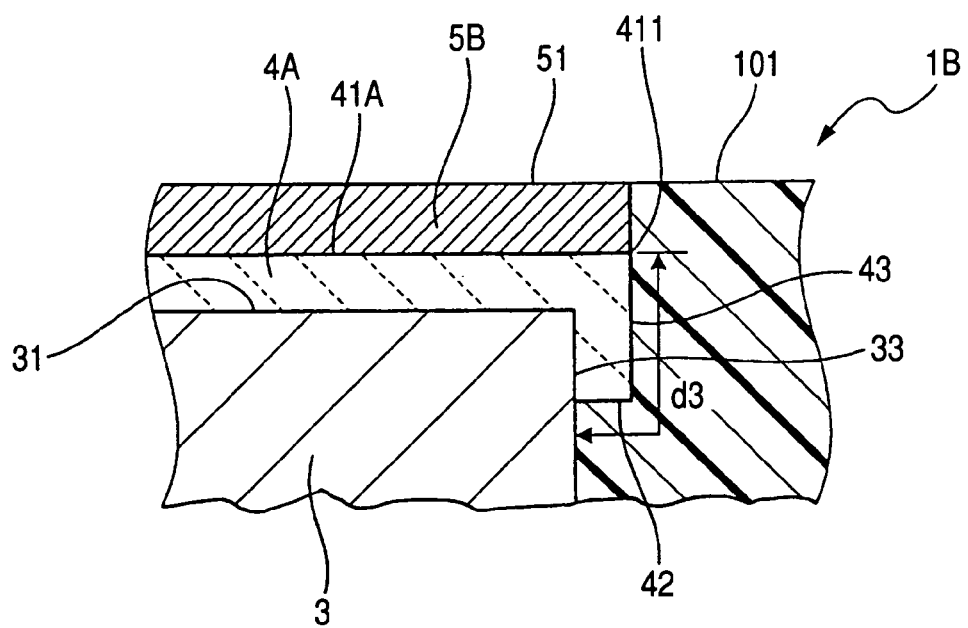
FIG. 18 is a fragmentary enlarged cross-sectional view of the semiconductor module of the third embodiment represented in the vicinity of an end portion of the insulation body.

As shown in FIG. 18, moreover, such a structure of the semiconductor module 1B of the present embodiment ensures an adequate in-solid-body insulating distance d3 between each heat radiation plate 3 and each metallic body 5B, thereby ensuring adequate insulating property.

Fourth Embodiment

A semiconductor module of a fourth embodiment according to the present invention and a method of manufacturing the same are described below with reference to FIGS. 19 and 20.

The semiconductor module 1C of the present embodiment differs from the semiconductor module 1 of the first embodiment in that the insulation bodies 4A are directly formed on the heat radiation plates 3 in the expanded areas, respectively, so as to cover the outside surfaces 31 of the pair of heat radiation plates 3 and at least the parts of the end faces 33 of the heat radiation plates 3, respectively, while metallic bodies 5C are directly formed on not only the outside surfaces 41A of the insulation bodies 4A but also at least parts of the sidewalls 4b of the insulation bodies 4A.

More particularly, the metallic bodies 5C are directly formed on the outside surfaces 41A and have sidewall portions 5Ca coveting the sidewalls 4b of the insulation bodies 4A so as to cover the edge portions 411 of the insulation bodies 4A formed to cover the edge portions 311 of the heat radiation plates 3. In addition, the sidewall portions 5Ca of the metallic bodies 5C have end edges 52 placed at positions retarded from the end edges 42 of the insulation bodies 4A.

The semiconductor module 1C of the present embodiment has the other same structure as that of the semiconductor module of the first embodiment.

Figure 19:
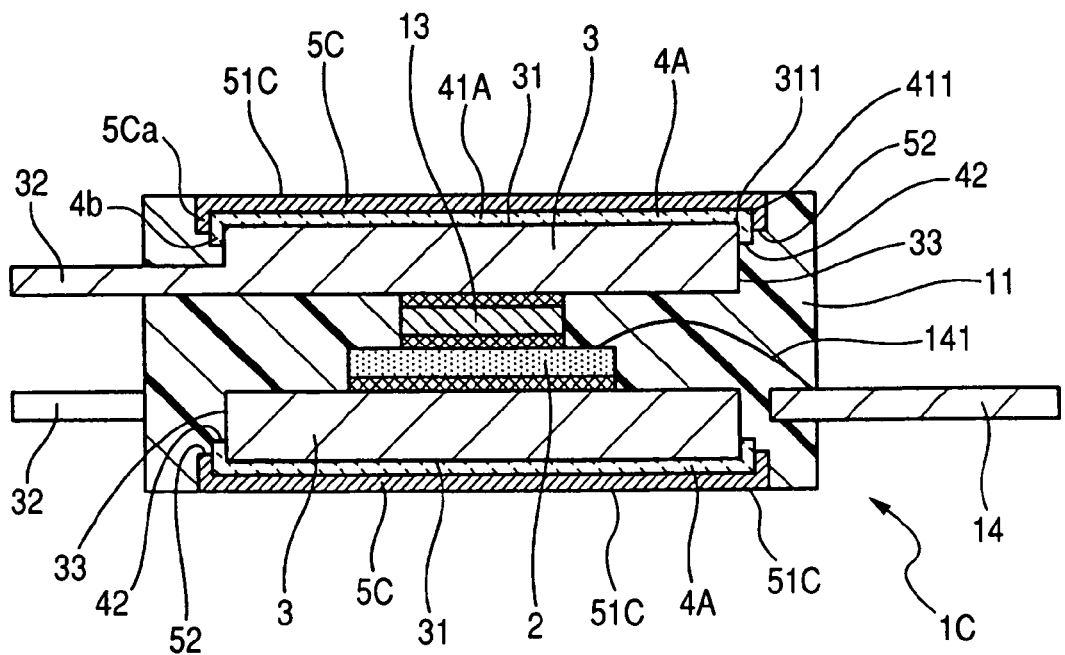
FIG. 19 is a cross-sectional view showing a semiconductor module of a fourth embodiment according to the present invention.
Figure 20:
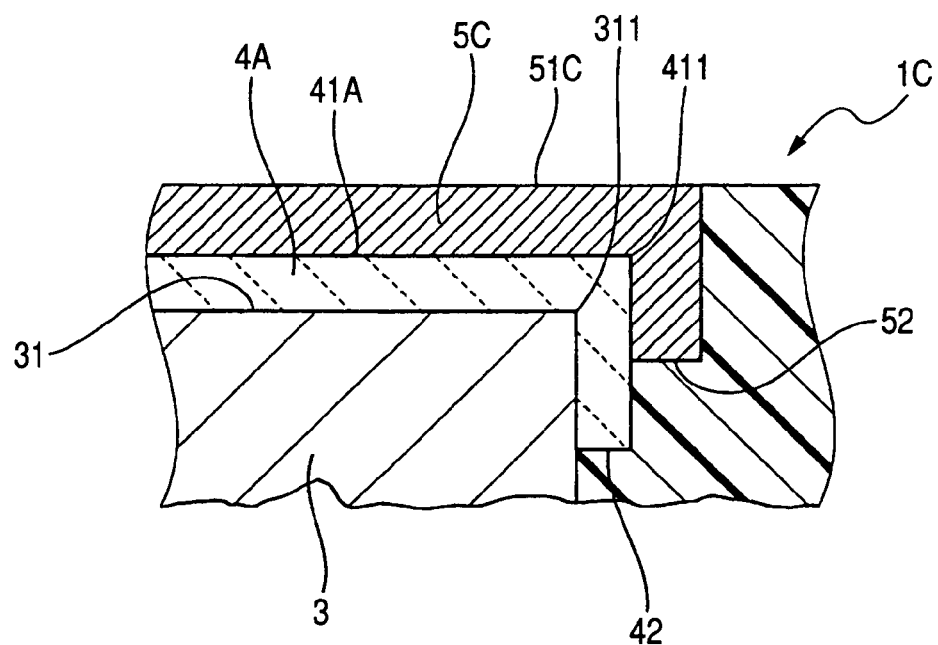
FIG. 20 is a fragmentary enlarged cross-sectional view of the semiconductor module of the fourth embodiment represented in the vicinity of an end portion of the insulation body.

With the method of manufacturing the semiconductor module 1C of the present embodiment, the metallic bodies 5C are formed in films in a manner as shown in FIG. 19. That is, the metallic bodies 5C are formed on the whole surfaces areas of the outside surfaces 41A of the insulation bodies 4 with the sidewall portions 5Ca placed on the sidewall portions 4b of the insulation bodies 4A. The method of manufacturing the semiconductor module 1C of the present embodiment includes other same steps as those of the method of manufacturing the semiconductor module 1A of the second embodiment.

With the semiconductor module 1C of the present embodiment, the metallic bodies 5C are formed in films so as to cover the outside surfaces 41A and the sidewall portions 4b of the insulation bodies 4A. This enables the metallic bodies 5C to effectively protect the edge portions 411 of the insulation bodies 4A.

That is, there is likelihood that stresses tend to concentrate at the edge portions 411 of the insulation bodies 4A. Therefore, peeling or cracking are more liable to occur on the edge portions 411 of the insulation bodies 4A than those encountered on the other areas of the insulation bodies 4A. Covering the edge portions 411 of the insulation bodies 4A with the metallic bodies 5C, each having relatively increased flexibility, enables the insulation bodies 4A to be prevented from encountering the peeling or cracking, etc.

The semiconductor module 1C of the present embodiment has the other same structure as that of the semiconductor module of the first embodiment.

Fifth Embodiment

A semiconductor module of a fifth embodiment according to the present invention and a method of manufacturing the same are described below with reference to FIGS. 21 to 23.

The semiconductor module 1D of the present embodiment differs from the semiconductor module 1 of the first embodiment in that a single heat radiation plate 3D is held in thermal contact with one of the main surfaces of the semiconductor element 2.

Figure 21:
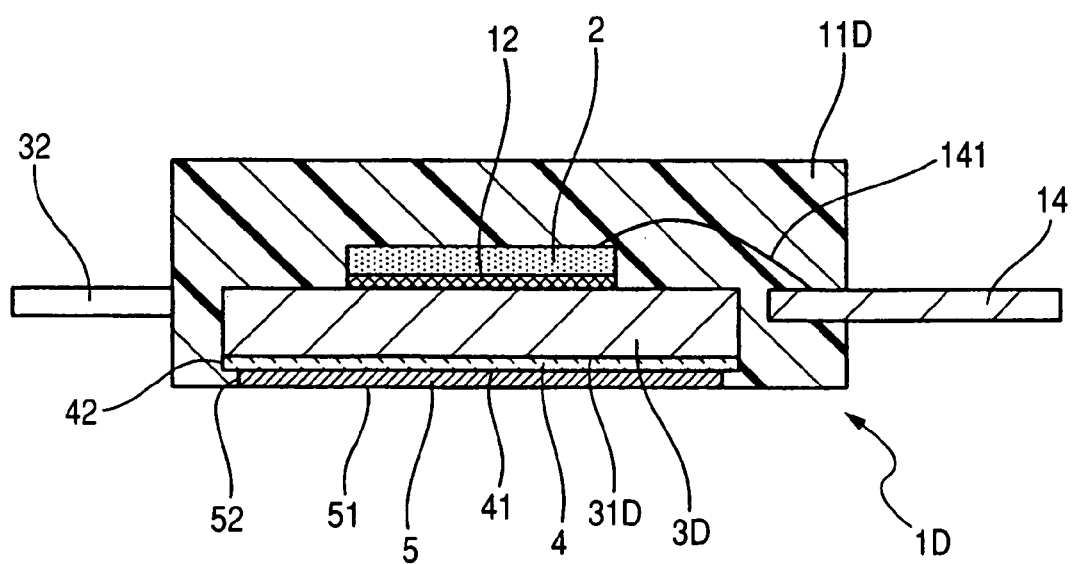
FIG. 21 is a cross-sectional view showing a semiconductor module of a fifth embodiment according to the present invention.

More particularly, as shown in FIG. 21, the semiconductor module 1D of the present embodiment includes the semiconductor element 2, and the heat radiation plate 3D bonded to the one of the main surfaces of the semiconductor element 2 via the soldering layer 12. In addition, the heat radiation plate 3D has an outside surface 31D, placed in opposition to the semiconductor element 2, on which the insulation body 4 is directly formed. The metallic body 5 is directly formed on the outside surface 41 of the insulation body 4 such that the end edges 52 of the metallic body 5 are placed inward of the end edges 42 of the insulation body 4.

Figure 22:
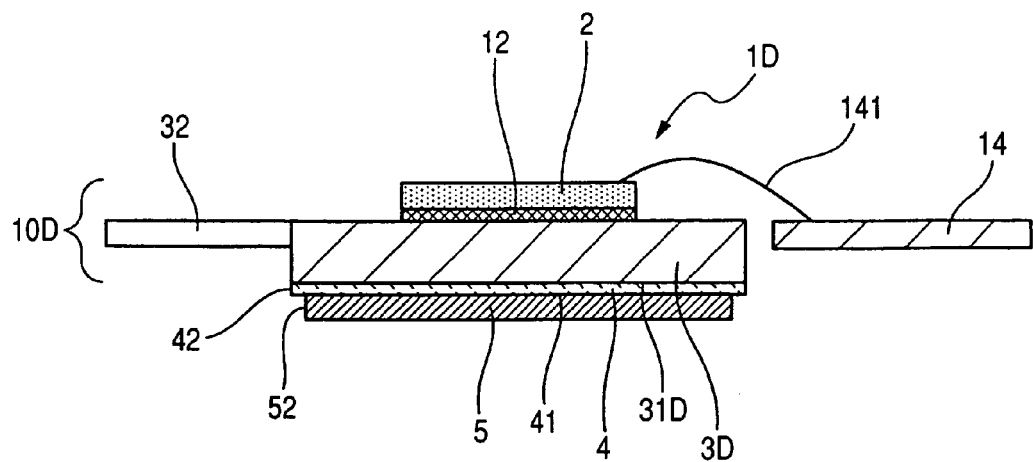
FIG. 22 is a cross-sectional view illustrating a method of manufacturing the semiconductor module of the fifth embodiment before a stack body and relevant component parts are molded with a mold resin.

In assembly, the semiconductor element 2, the heat radiation plate 3D and the metallic body 5 are stacked on one another, thereby forming a stack body 10D as shown in FIG. 22. Then, the stack body 10D is covered with a mold resin 11D. Subsequently, the mold resin 11D is subjected to machining through cutting or grinding to a level indicated by the broken line G such that the metallic body 5 is exposed to the outside. This allows the semiconductor module 1D to have one surface formed with a cooling surface.

The method of manufacturing the semiconductor module 11D fundamentally includes the nearly same steps as those of the method of manufacturing the semiconductor module 1 of the first embodiment.

That is, as shown in FIG. 22, the semiconductor element 2 and the heat radiation plate 3 are bonded to each other by means of the soldering layer 12, thereby preparing the stack body 10D. Then, the insulation body 4 is directly formed on the outside surface 31 of the heat radiation plate 3D and, subsequently, the metallic body 5 is directly formed on the outside surface 41 of the insulation body 4 such that the metallic body 5 has the end edges 52 placed inward of the end edges 42 of the insulation body 4. During such forming steps, the insulation body 4 and the metallic body 5 may be preferably formed in films before the stack body 10D is prepared.

Further, the signal terminal 14 is electrically connected to the base terminal 2a of the semiconductor element 2 using the bonding wire 141.

Furthermore, the insulation body 4 is formed in the film by plasma CVD (Plasma Chemical Vapor Deposition) and the metallic body 5 is formed in the film by the sputtering method.

Figure 23:
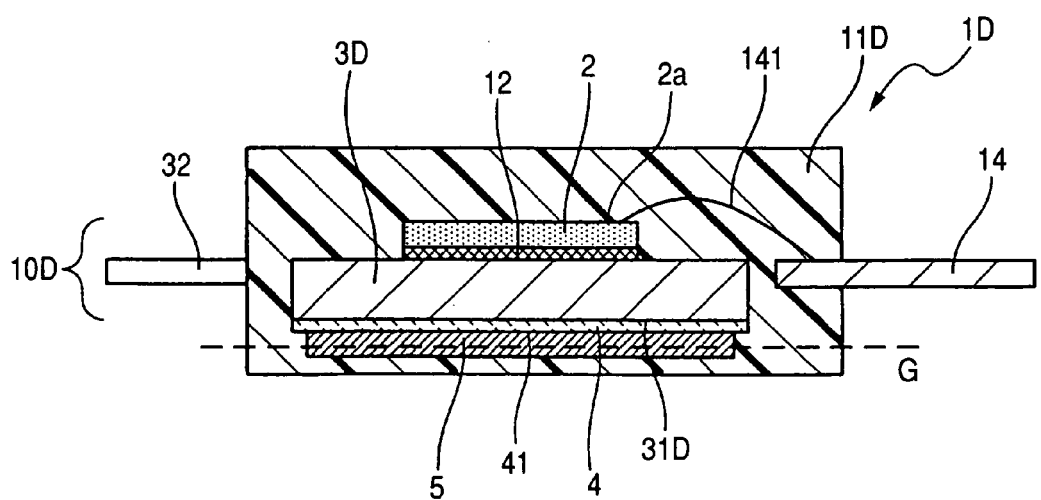
FIG. 23 is a cross-sectional view illustrating the method of manufacturing the semiconductor module of the fifth embodiment after the stack body and the relevant component parts are molded with the mold resin.

As shown in FIG. 23, subsequently, the mold resin 11D is formed so as to cover the stack body 10D, the insulation body 4 and the metallic body 5. Under such a state, all of constructional elements of the semiconductor module 1D are covered with the mold resin 11D with a part of the electrode terminal 32 and a part of the signal terminal 14 being exposed to the outside of the mold resin 11D.

Thereafter, by machining the surface of the metallic body 5 and the mold resin 11D by cutting or grinding, the part of the metallic body 5 is exposed to the outside of the mold resin 11D. That is, the cutting or grinding is performed on the mold resin 11D and the metallic body 5 to the level indicated by the broken line G shown in FIG. 23.

With the foregoing, the semiconductor module 1D is obtained with one main surface to which the outside surface 51 of the metallic body 5 is exposed as shown in FIG. 21.

The semiconductor module 1D of the present embodiment has the other same structure as that of the semiconductor module of the first embodiment.

With the present embodiment, a minimum number of component parts can be employed, thereby obtaining the semiconductor module 1D that can be easily manufactured at low cost.

Moreover, in manufacturing the semiconductor modules 1 to 1D of the various embodiments set forth above, the mold resin and the metallic body may be preferably subjected to the machining step such as cutting or grinding. However, such a machining step is not necessarily required.

For instance, by devising a structure of a molding die assembly for molding the mold resin, the mold resin can be formed in a structure to allow the outside surface of the metallic body to be exposed to the outside of the mold resin.

In such a case, there is a risk of a difficulty of adequately ensuring smoothness of the outside surface of the metallic body and it becomes difficult to allow the metallic body 5 to be held in contact with the cooling unit 6 in an increased contact surface area.

However, there is no need to perform the machining step such as cutting or grinding with a resultant increase in productivity, resulting in an advantage of achieving a reduction in production cost.

While the specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A semiconductor module comprising:
a semiconductor element having an electrode;
a heat radiation plate placed in thermal contact with a main surface of the semiconductor element and electrically connected to the electrode of the semiconductor element;
an insulation body directly formed on an outside surface of the heat radiation plate, the heat radiation plate, the semiconductor element and the insulation body being stacked on each other to form a stack body;
a mold resin unitarily molding the stack body; and
a metallic body directly formed on an outside surface of the insulation body; the metallic body having end edges placed at positions displaced inward from end edges of the insulation body; and
the insulation body being covered with the metallic body and the mold resin;
wherein the metallic body has an outside surface exposed to an outside of the mold resin.

2. The semiconductor module according to claim 1, wherein:
the insulation body includes a main surface portion, directly formed on the outside surface of the heat radiation plate, and sidewall portions directly formed on at least parts of end edges of the heat radiation plate.

3. The semiconductor module according to claim 1, wherein:
the insulation body includes a main surface portion, directly formed on the outside surface of the heat radiation plate, and sidewall portions directly formed on at least parts of end edges of the heat radiation plate; and
the metallic body has end edges placed at positions displaced inward from end edges of the insulation body.

4. The semiconductor module according to claim 1, wherein:
the insulation body includes an insulation film formed on the beat radiation plate in a film by at least one of CVD, PVD and thermal spraying.

5. The semiconductor module according to claim 1, wherein:
the metallic body includes a metallic film formed on the insulation body in a film by at least one of PVD, CVD and thermal spraying.

6. The semiconductor module according to claim 1, wherein:
the insulation body is made of inorganic material.

7. The semiconductor module according to claim 1, wherein:
the metallic body is made of metal selected from a group consisting of aluminum, nickel, copper, silver, gold and an alloy of these components.

8. The semiconductor module according to claim 1, wherein:
the heat radiation plate is made of metal selected from a group consisting of aluminum, copper and an alloy of these components.

9. The semiconductor module according to claim 1, wherein:
the heat radiation plate includes a pair of heat radiation plates placed on both main surfaces of the semiconductor element.

* * * * *